United States Patent
Nakamura et al.

(10) Patent No.: US 9,559,654 B2
(45) Date of Patent: Jan. 31, 2017

(54) POWER AMPLIFICATION MODULE

(71) Applicant: Murata Manufacturing Co., Ltd., Kyoto (JP)

(72) Inventors: Hayato Nakamura, Kyoto (JP); Mitsuo Ariie, Kyoto (JP); Tadashi Matsuoka, Kyoto (JP); Tsutomu Onaro, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/520,467

(22) Filed: Oct. 22, 2014

(65) Prior Publication Data

US 2015/0130537 A1 May 14, 2015

(30) Foreign Application Priority Data

Nov. 11, 2013 (JP) .................. 2013-233027

(51) Int. Cl.
*H03G 3/30* (2006.01)
*H03F 3/21* (2006.01)
(Continued)

(52) U.S. Cl.
CPC .......... *H03G 3/3047* (2013.01); *H03F 1/0261* (2013.01); *H03F 1/22* (2013.01); *H03F 3/195* (2013.01); *H03F 3/211* (2013.01); *H03G 1/0029* (2013.01); *H03F 2200/144* (2013.01); *H03F 2200/153* (2013.01); *H03F 2200/18* (2013.01); *H03F 2200/408* (2013.01); *H03F 2200/451* (2013.01); *H03F 2203/21112* (2013.01); *H03F 2203/45138* (2013.01); *H03F 2203/45528* (2013.01)

(58) Field of Classification Search
USPC ............. 330/295, 124 R, 310–311, 285, 296
See application file for complete search history.

(56) References Cited

U.S. PATENT DOCUMENTS 5,926,069 A 7/1999 Ko et al.
7,956,682 B2 * 6/2011 Hasegawa ............... H03F 1/223
330/311

(Continued)

FOREIGN PATENT DOCUMENTS

JP H09-270645 A 10/1997
JP 2005-005944 A 1/2005

(Continued)

*Primary Examiner* — Hieu Nguyen
(74) *Attorney, Agent, or Firm* — Pearne & Gordon LLP

(57) ABSTRACT

Disclosed is a power amplification module which has a comparatively small size and is capable of adjusting the rising characteristic of a gain. The power amplification module includes a first gain control current generation circuit which generates a first gain control current changing with a control voltage, a first bias current generation circuit which generates a first bias current according to the first gain control current, a gain control voltage generation circuit which generates a gain control voltage changing with the control voltage, a first transistor which is emitter-grounded and in which an input signal and the first bias current are supplied to a base thereof, and a second transistor which is cascode-connected to the first transistor and in which the gain control voltage is supplied to a base thereof and a first output signal obtained by amplifying the input signal is output from a collector thereof.

20 Claims, 8 Drawing Sheets

(51) Int. Cl.
  *H03F 3/193* (2006.01)
  *H03F 1/02* (2006.01)
  *H03F 1/22* (2006.01)
  *H03F 3/195* (2006.01)
  *H03G 1/00* (2006.01)

(56) References Cited

U.S. PATENT DOCUMENTS

| | | | |
|---|---|---|---|
| 8,150,343 B2* | 4/2012 | Ramachandra | H03F 1/0227 |
| | | | 455/107 |
| 8,319,549 B2* | 11/2012 | Sengupta | H03F 1/0266 |
| | | | 330/124 R |
| 8,749,309 B2* | 6/2014 | Ho | H03G 1/007 |
| | | | 330/285 |
| 8,928,414 B2* | 1/2015 | Roux | H03F 1/22 |
| | | | 330/260 |
| 2008/0180169 A1 | 7/2008 | Ripley | |

FOREIGN PATENT DOCUMENTS

| JP | 2006-303850 A | 11/2006 |
|---|---|---|
| JP | 2012-095333 A | 5/2012 |
| JP | 2013-070426 A | 4/2013 |

* cited by examiner

POWER AMPLIFICATION MODULE

BACKGROUND OF THE INVENTION

Field of the Invention

The present invention relates to a power amplification module.

Background Art

In a radio communication system, such as GSM® (Global System for Mobile Communications) or EDGE (Enhanced Data Rates for GSM Evolution), during a burst operation to continuously send data from a communication terminal, there is a demand for changing power of a transmission signal (burst signal) according to the waveform characteristic defined by the communication standard.

A specific example will be described. FIG. 10 is a diagram illustrating an example of a waveform characteristic defined for a burst operation. As illustrated in FIG. 10, it is desirable to control the level of the transmission signal such that the signal level of the transmission signal falls between an upper limit ($L_{UL}$) and a lower limit ($L_{DL}$). As a method of controlling the level of the transmission signal, two kinds of a method of controlling input power with a constant gain of the power amplification module and a method of controlling the gain of the power amplification module with constant input power are known.

CITATION LIST

Patent Documents

[Patent Document 1] JP 2012-95333 A
[Patent Document 2] US 2008/0180169 A

SUMMARY OF THE INVENTION

For example, Patent Document 1 discloses a configuration in which, in order to control the gain of a power amplification module conforming to a waveform characteristic defined for a burst operation, the bias of the power amplification module is controlled. Specifically, a configuration in which the gain of the power amplification module is controlled by a ramp voltage $V_{RAMP}$ is disclosed.

However, in the configuration in which the gain of the power amplification module is controlled by the ramp voltage, the ratio ($\Delta RF_{OUT}/\Delta V_{RAMP}$) (hereinafter, also referred to as "slope") of the amount of change in an output signal $RF_{OUT}$ to the amount of change in the ramp voltage $V_{RAMP}$ is likely to become larger. In this way, if the slope becomes larger, when increasing the gain of the power amplification module in a ramp-up period (FIG. 10: $T_{UP}$), the rising of the gain becomes steeper, and it is difficult to make power of the output signal change with the waveform characteristic.

Accordingly, instead of the configuration in which the gain of the power amplification module is controlled by the ramp voltage, as disclosed in Patent Document 2, a configuration in which the gain is controlled by a low drop output (LDO) regulator is considered. However, if a configuration in which the gain is controlled using the LDO regulator is used, in general, the chip size becomes larger compared to a configuration in which the gain is controlled by the ramp voltage.

The invention has been accomplished in consideration of this situation, and an object of the invention is to provide a power amplification module which has a comparatively small size and is capable of adjusting the rising characteristic of the gain.

A power amplification module according to an aspect of the invention includes a first gain control current generation circuit which generates a first gain control current changing with a control voltage, a first bias current generation circuit which generates a first bias current according to the first gain control current, a gain control voltage generation circuit which generates a gain control voltage changing with the control voltage, a first transistor which is emitter-grounded and in which an input signal and the first bias current are supplied to a base thereof, and a second transistor which is cascode-connected to the first transistor and in which the gain control voltage is supplied to a base thereof and a first output signal obtained by amplifying the input signal is output from a collector thereof.

According to the invention, it is possible to provide a power amplification module which has a comparatively small size and is capable of adjusting the rising characteristic of the gain.

DESCRIPTION OF THE PREFERRED EMBODIMENTS

Figure 1:
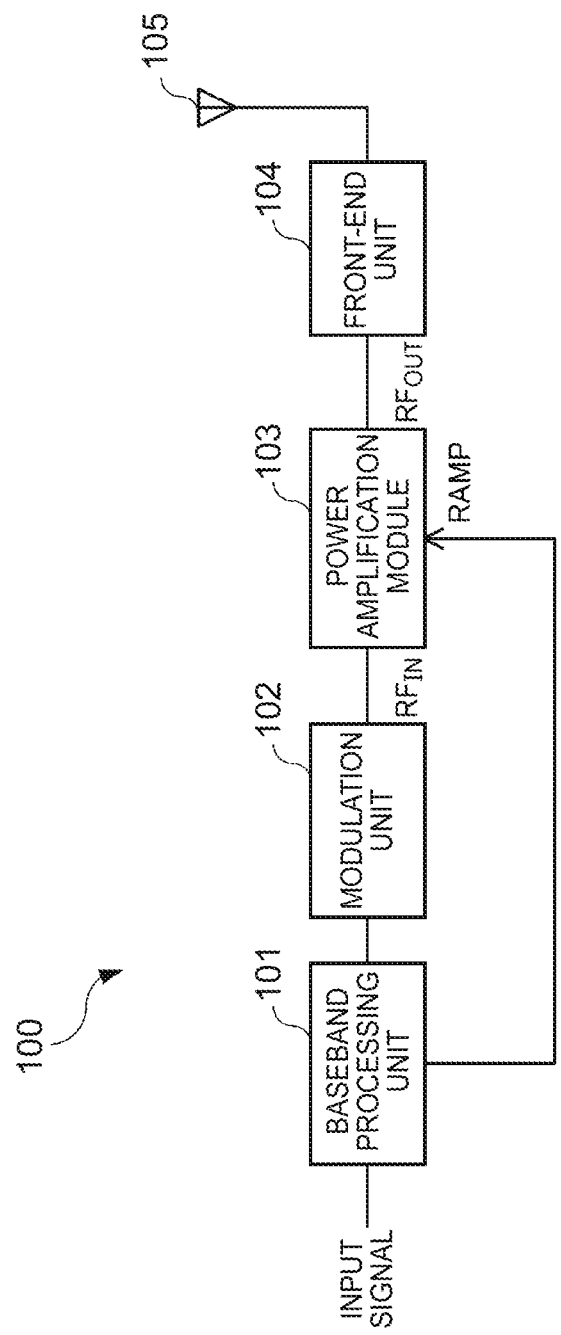
FIG. 1 is a diagram illustrating a configuration example of a transmission unit which includes a power amplification module according to an embodiment of the invention.

Hereinafter, an embodiment of the invention will be described referring to the drawings. FIG. 1 is a diagram illustrating a configuration example of a transmission unit which includes a power amplification module according to an embodiment of the invention. A transmission unit 100 is used to transmit various signals, such as sound or data, to a base station, for example, in a mobile communication device, such as a mobile phone. Although the mobile communication device also includes a reception unit which receives signals from the base station, and a description thereof will be omitted.

As illustrated in FIG. 1, the transmission unit 100 includes a baseband processing unit 101, a modulation unit 102, a power amplification module 103, a front-end unit 104, and an antenna 105.

The baseband processing unit 101 executes baseband processing for an input signal. The baseband processing unit 101 outputs a control signal RAMP for controlling the gain of the power amplification module 103 conforming to a waveform characteristic defined for a burst operation.

The modulation unit 102 modulates a baseband signal based on a modulation system, such as GSM® or EDGE, and generates a radio frequency (RF) signal for radio transmission. The RF signal has a frequency of about several hundred MHz to several GHz.

The power amplification module 103 amplifies power of the RF signal ($RF_{IN}$) to a level desirable for transmission to the base station and outputs an output signal $RF_{OUT}$. For example, the gain of the power amplification module 103 is controlled based on the control signal RAMP supplied from the baseband processing unit 101 to follow the waveform characteristic for the burst operation defined by the communication standard.

The front-end unit 104 performs filtering for the output signal, switching with a reception signal received from the base station, or the like. A signal output from the front-end unit 104 is transmitted to the base station through the antenna 105.

Figure 2:
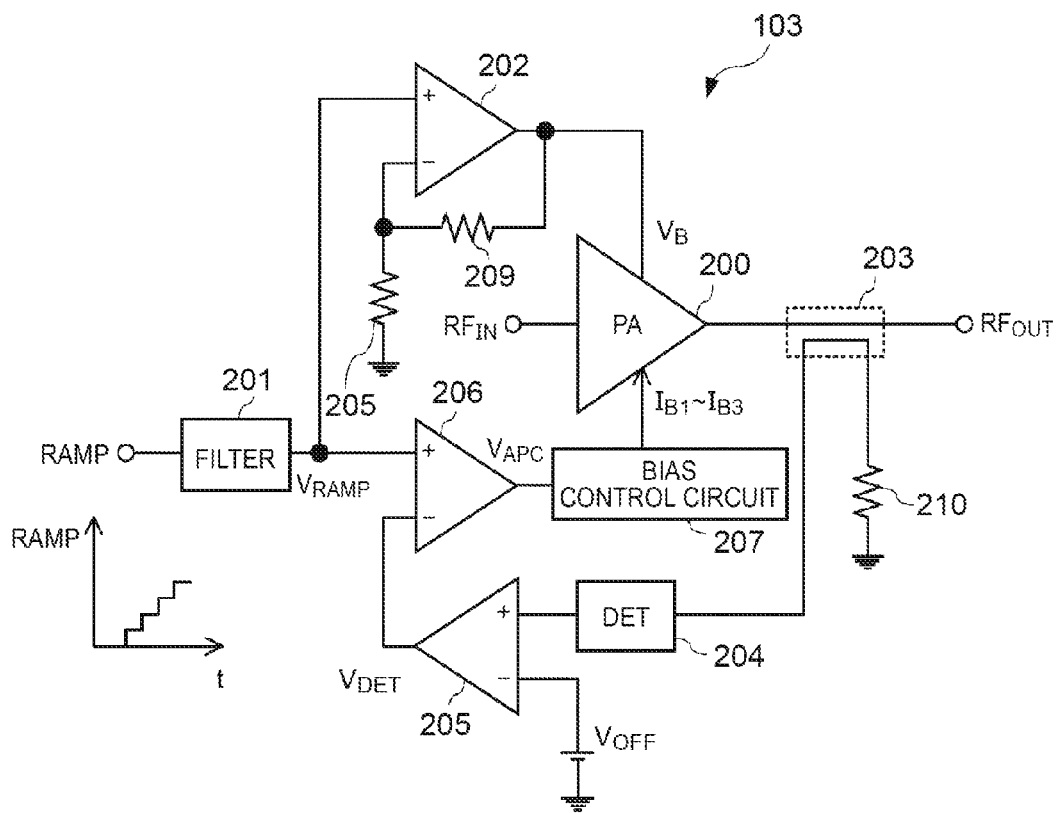
FIG. 2 is a diagram illustrating an example of the configuration of the power amplification module.

FIG. 2 is a diagram illustrating an example of the configuration of the power amplification module 103. As illustrated in FIG. 2, the power amplification module 103 includes a power amplifier 200, a filter 201, an operational amplifier 202, a directional coupler 203, a detector 204, a differential amplifier 205, an error amplifier 206, a bias control circuit 207, and resistors 208 to 210.

A gain control voltage $V_B$ and gain control currents $I_{B1}$ to $I_{B3}$ for controlling a gain are supplied to the power amplifier 200. The power amplifier 200 amplifies power of the input RF signal ($RF_{IN}$) with a gain according to the gain control voltage $V_B$ and the gain control currents $I_{B1}$ to $I_{B3}$, and outputs the output signal $RF_{OUT}$. The details of the power amplifier 200 will be described below.

The filter 201 outputs a control voltage $V_{RAMP}$ obtained by smoothing control signal RAMP (discrete time analog signal) for controlling the gain of the power amplifier 200. For example, the control signal RAMP is controlled such that the output signal $RF_{OUT}$ follows the waveform characteristic for the burst operation defined by the communication standard.

The operational amplifier 202 and the resistors 208 and 209 constitute a non-inverting amplifier circuit. That is, the gain control voltage $V_B$ which changes with the control voltage $V_{RAMP}$ is output from the output terminal of the operational amplifier 202.

The directional coupler 203 extracts a part of the output signal $RF_{OUT}$ output from the power amplifier 200 and outputs the extracted signal to the resistor 210 as a load.

The detector 204 detects a signal extracted by the directional coupler 203 and inputs the signal to a non-inverting input terminal of the differential amplifier 205. A voltage output from the detector 204 becomes a level according to the output signal $RF_{OUT}$.

The differential amplifier 205 amplifies the difference between a voltage input to the non-inverting input terminal and an offset voltage $V_{OFF}$ input to an inverting input terminal, and outputs a detection voltage $V_{DET}$. Since the voltage input to the non-inverting input terminal has the level according to the output signal $RF_{OUT}$, the detection voltage $V_{DET}$ corresponds to the level of the output signal $RF_{OUT}$.

The error amplifier 206 outputs a voltage $V_{APC}$ obtained by amplifying the difference (error) between the control voltage $V_{RAMP}$ input to the non-inverting input terminal and the detection voltage $V_{DET}$ input to the inverting input terminal.

Figure 3:
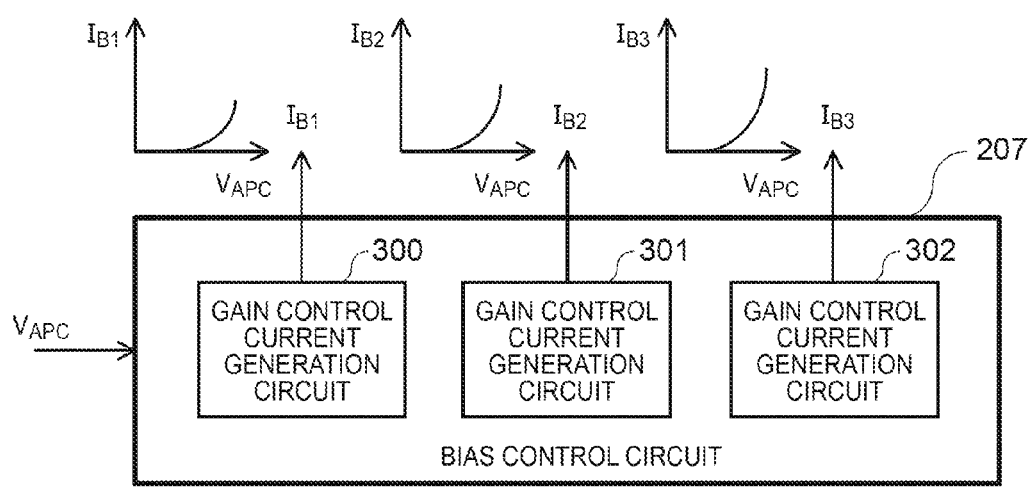
FIG. 3 is a block diagram illustrating an example of the configuration of a bias control circuit.

The bias control circuit 207 outputs the gain control currents $I_{B1}$ to $I_{B3}$ for controlling the gain of the power amplifier 200 based on the voltage $V_{APC}$. FIG. 3 is a block diagram illustrating an example of the configuration of the bias control circuit 207. As illustrated in FIG. 3, the bias control circuit 207 includes gain control current generation circuits 300 to 302 (first gain control current generation circuit to third gain control current generation circuit). The gain control current generation circuits 300 to 302 respectively output the gain control currents $I_{B1}$ to $I_{B3}$ based on the voltage $V_{APC}$. Specifically, as illustrated in FIG. 3, the control currents $I_{B1}$ to $I_{B3}$ change in a quadratic curve shape with the voltage $V_{APC}$ (that is, with $V_{RAMP}$). The thus-generated control currents $I_{B1}$ to $I_{B3}$ are used to control the bias currents in the respective stages of a three-stage amplifier circuit constituting the power amplifier 200. The amount of current of each of the control currents $I_{B1}$ to $I_{B3}$ is appropriately set based on the transistor size or the like in each stage. The change characteristics of the control currents $I_{B1}$ to $I_{B3}$ are not limited to a quadratic curve shape and may have other curve shape, such as a linear shape.

In the configuration illustrated in FIG. 2, the non-inverting amplifier circuit (gain control voltage generation circuit) which is constituted by the operational amplifier 202 and the resistors 208 and 209 constitute a feed forward circuit which outputs the gain control voltage $V_B$ for controlling the gain of the power amplifier 200 based on the control voltage $V_{RAMP}$. For example, if the control voltage $V_{RAMP}$ is raised, the gain control voltage $V_B$ is raised, and the gain of the power amplifier 200 is raised.

In the configuration illustrated in FIG. 2, the directional coupler 203, the resistor 210, the detector 204, the differential amplifier 205, the error amplifier 206, and the bias control circuit 207 constitute a feedback circuit which outputs the gain control currents $I_{B1}$ to $I_{B3}$ for controlling the gain of the power amplifier 200 such that the output signal $RF_{OUT}$ becomes a level according to the control voltage $V_{RAMP}$. For example, if the control voltage $V_{RAMP}$ is raised, the voltage $V_{APC}$ is raised, the gain control currents $I_{B1}$ to $I_{B3}$ increase, and the gain of the power amplifier 200 is raised.

Figure 4:
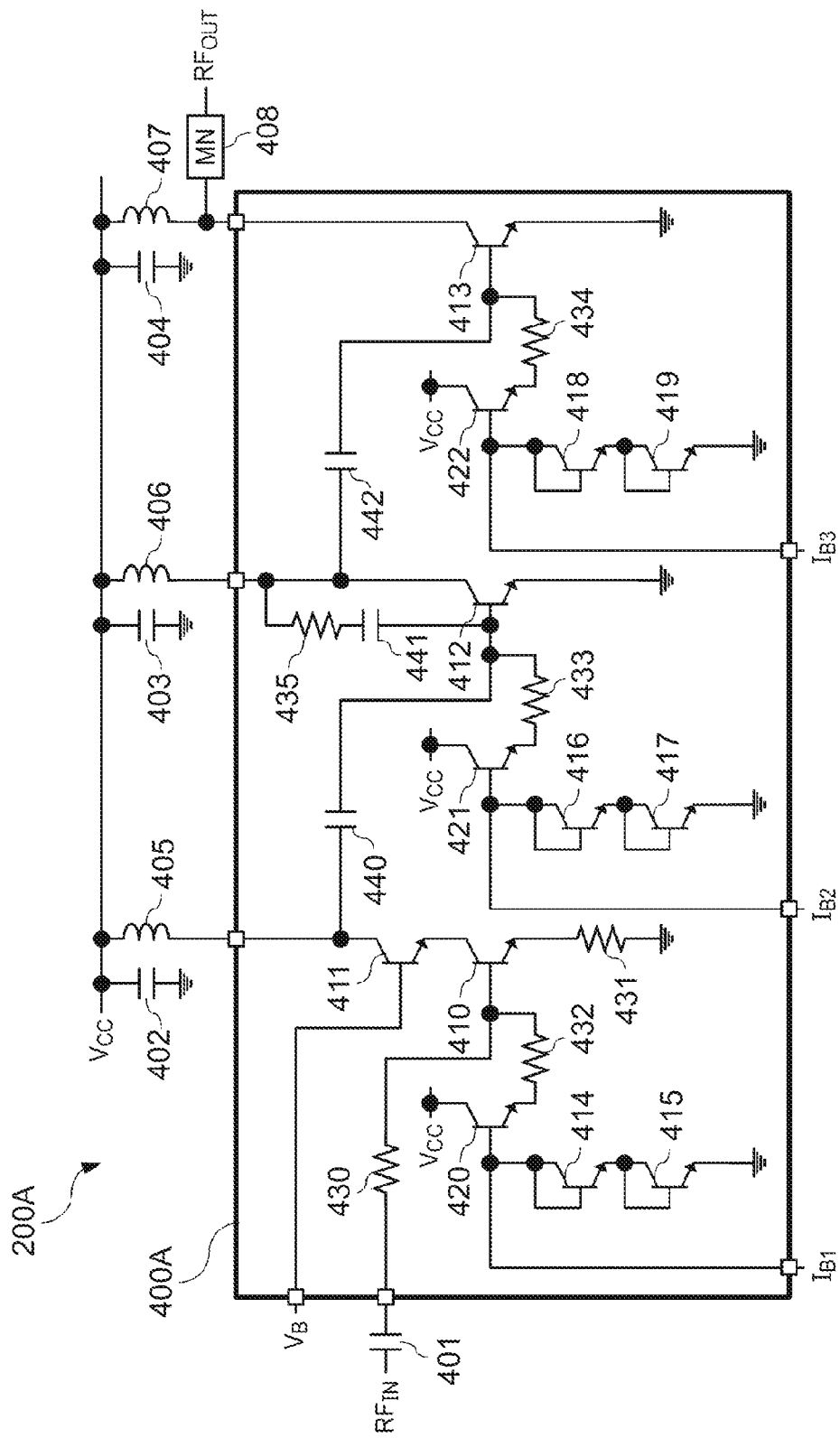
FIG. 4 is a diagram illustrating an example of the configuration of a power amplifier.

FIG. 4 is a diagram illustrating the configuration of a power amplifier 200A which is an example of the power amplifier 200. As illustrated in FIG. 4, the power amplifier 200A includes an HBT chip 400A, capacitors 401 to 404, inductors 405 to 407, and a matching circuit 408.

The HBT chip 400A is an integrated circuit which includes a heterojunction bipolar transistor (HBT). In this embodiment, although a transistor is an HBT, the transistor is not limited to an HBT. The HBT chip 400A amplifies the RF signal ($RF_{IN}$) input through the capacitor 401 and outputs the output signal $RF_{OUT}$ through the matching circuit 408. As illustrated in FIG. 4, the HBT chip 400A includes NPN transistors (hereinafter, simply referred to as "transistor") 410 to 422, resistors 430 to 435, and capacitors 440 to 442.

The HBT chip 400A includes a three-stage amplifier circuit. The first stage amplifier circuit includes the transistors 410 and 411, the second stage amplifier circuit includes the transistor 412, and the third stage amplifier circuit includes the transistor 413. In this embodiment, although an example where a power amplifier is constituted by a three-stage amplifier circuit has been described, the number of stages of amplifier circuits in a power amplifier is not limited thereto.

The first stage amplifier circuit is constituted by the transistor 410 (first transistor) and the transistor 411 (second transistor) which are cascode-connected. Specifically, the transistor 410 has an emitter which is grounded through the resistor 431, and the transistor 411 has an emitter which is connected to the collector of the transistor 410. The transistors 410 and 411 may have, for example, the same size.

The RF signal ($RF_{IN}$) is input to the base of the transistor 410 through the capacitor 401 and the resistor 430. A bias current according to the gain control current $I_{B1}$ is input to the base of the transistor 410. The gain control voltage $V_B$ is input to the base of the transistor 411. A power supply voltage $V_{CC}$ is supplied to the collector of the transistor 411 through the inductor 405.

The first stage amplifier circuit which is constituted by the transistors 410 and 411 amplifies the input signal input to the base of the transistor 410 and outputs the amplified signal from the collector of the transistor 411.

The second stage amplifier circuit is constituted by the transistor 412 (third transistor). In the transistor 412, an emitter is grounded, and the power supply voltage $V_{CC}$ is supplied to a collector through the inductor 406. The output of the first stage amplifier circuit is input to the base of the transistor 412 as an input signal. A bias current according to the gain control current $I_{B2}$ is input to the base of the transistor 412.

The second stage amplifier circuit which is constituted by the transistor 412 amplifies the input signal input to the base of the transistor 412 and outputs the amplified signal from the collector of the transistor 412. The resistor 435 and the capacitor 441 which are connected in series and function as a negative feedback circuit for stabilizing an amplification operation are provided between the base and the collector of the transistor 412.

The third stage amplifier circuit is constituted by the transistor 413 (fifth transistor). In the transistor 413, an emitter is grounded, and the power supply voltage $V_{CC}$ is supplied to a collector through the inductor 407. The output of the second stage amplifier circuit is input to the base of the transistor 413 as an input signal. A bias current according to the gain control current $I_{B3}$ is input to the base of the transistor 413.

The third stage amplifier circuit which is constituted by the transistor 413 amplifies the input signal input to the base of the transistor 413 and outputs the amplified signal from the collector of the transistor 413.

The diode-connected transistor 414 is connected in series with the diode-connected transistor 415. The base of the transistor 420 is connected to the collector of the transistor 414. The gain control current $I_{B1}$ is input to the base of the transistor 420. The emitter of the transistor 420 is connected to the base of the transistor 410 through the resistor 432. The transistors 414, 415, and 420 and the resistor 432 constitute a bias current generation circuit which supplies the bias current according to the gain control current $I_{B1}$ to the base of the transistor 410.

Similarly, the transistors 416, 417, and 421 and the resistor 433 constitute a bias current generation circuit which supplies the bias current according to the gain control current $I_{B2}$ to the base of the transistor 412. The transistors 418, 419 and 422 and the resistor 434 constitute a bias current generation circuit which supplies the bias current according to the gain control current $I_{B3}$ to the base of the transistor 413.

As described above, the first stage amplifier circuit is constituted by the cascode-connected transistors 410 and 411. The bias current according to the gain control current $I_{B1}$ is input to the base of the transistor 410, and the gain control voltage $V_B$ is input to the base of the transistor 411. Accordingly, the gain of the first stage amplifier circuit is controlled by both the gain control current $I_{B1}$ and the gain control voltage $V_B$.

Figure 5A:
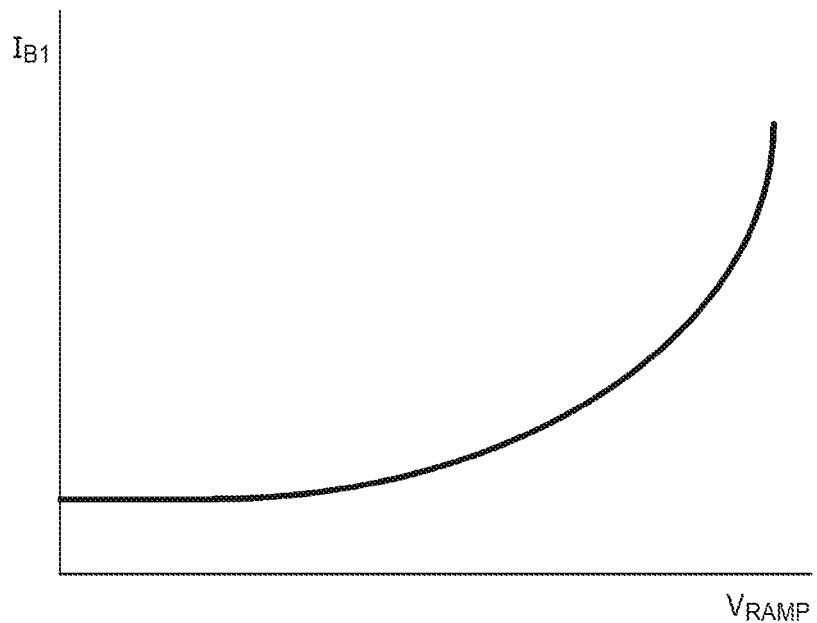
FIG. 5A is a diagram illustrating an example of the relationship between a control voltage and a gain control current.
Figure 5B:
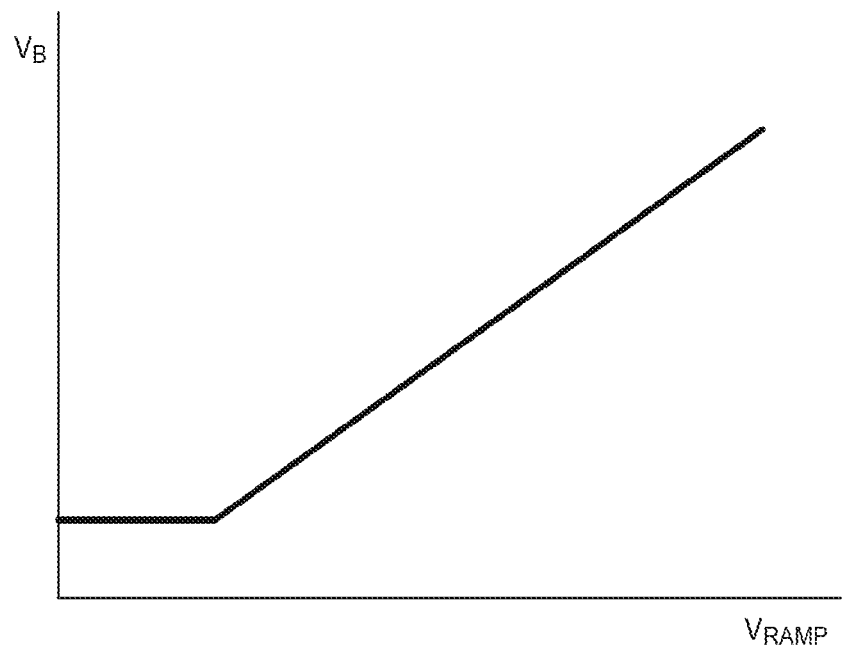
FIG. 5B is a diagram illustrating an example of the relationship between a control voltage and a gain control voltage.

FIG. 5A is a diagram illustrating an example of the relationship between the control voltage $V_{RAMP}$ and the gain control current $I_{B1}$. As illustrated in FIG. 5A, the gain control current $I_{B1}$ changes in a quadratic curve shape with the control voltage $V_{RAMP}$. FIG. 5B is a diagram illustrating an example of the relationship between the control voltage $V_{RAMP}$ and the gain control voltage $V_B$. As illustrated in FIG. 5B, the gain control voltage $V_B$ changes in a linear shape with the control voltage $V_{RAMP}$.

As illustrated in FIG. 5A, since the gain control current $I_{B1}$ increases with the rise of the control voltage $V_{RAMP}$, the gain of the first stage amplifier circuit is raised with the rise of the control voltage $V_{RAMP}$. As illustrated in FIG. 5B, since the gain control voltage $V_B$ is raised with the rise of the control voltage $V_{RAMP}$, the gain of the first stage amplifier circuit is raised with the rise of the control voltage $V_{RAMP}$.

In a region where the control voltage $V_{RAMP}$ is low, since the gain control voltage $V_B$ is low, a voltage which is supplied to the collector terminal of the transistor 410 is lowered. Accordingly, it is possible to reduce the gain of the first stage amplifier circuit in a region where the control voltage $V_{RAMP}$ is low compared to a case where the first stage amplifier circuit is constituted by the single transistor 410 and the gain is controlled only by the gain control current $I_{B1}$. That is, it is possible to reduce the slope ($\Delta RF_{OUT}/\Delta V_{RAMP}$) in a region where the control voltage $V_{RAMP}$ is low and to make the rising of the gain in the power amplifier 200A gentle. With this, for example, during a burst operation, such as GSM® or EDGE, it becomes easy to perform control for changing power of the output signal $RF_{OUT}$ according to the waveform characteristic defined by the communication standard.

Figure 6:
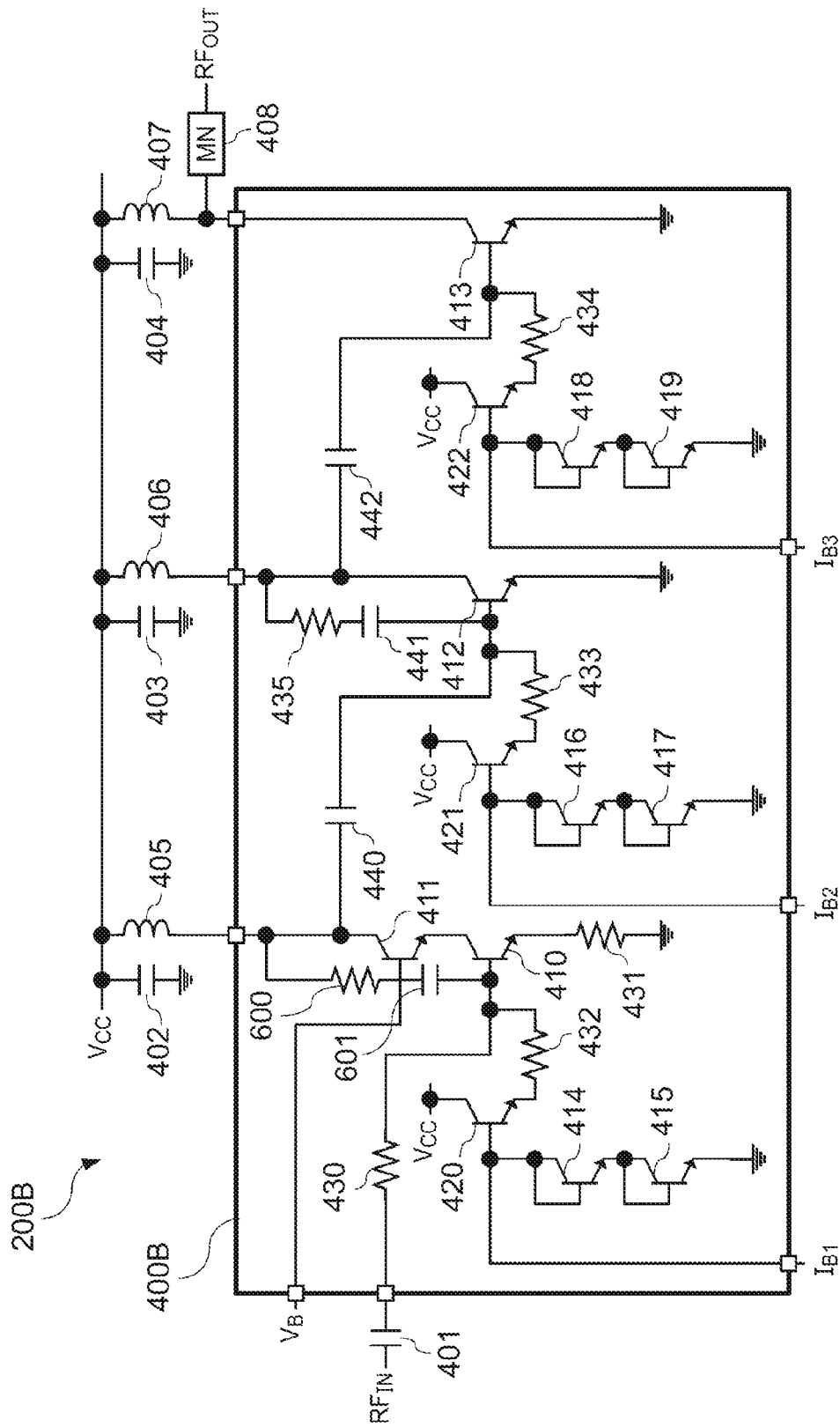
FIG. 6 is a diagram illustrating another example of the configuration of the power amplifier.

FIG. 6 is a diagram illustrating the configuration of a power amplifier 200B which is another example of the power amplifier 200. The same components as those of the power amplifier 200A illustrated in FIG. 4 are represented by the same reference numerals, and descriptions thereof will not be repeated.

The power amplifier 200B includes an HBT chip 400B, a resistor 600 and a capacitor 601, in addition to the configuration of the power amplifier 200A. The resistor 600 and the capacitor 601 are connected in series and are provided between the base of the transistor 410 and the collector of the transistor 411. The resistor 600 and the capacitor 601 constitute a negative feedback circuit for stabilizing an amplification operation of the first stage amplifier circuit constituted by the transistors 410 and 411.

For example, it is assumed that the first stage amplifier circuit has a general configuration which is the same configuration as the second stage amplifier circuit, that is, has a single transistor, and has the same negative feedback circuit as the resistor 435 and the capacitor 441. When the general configuration (single configuration) is changed to a configuration (cascode configuration) in which the first stage amplifier circuit is substituted with the cascode-connected transistors 410 and 411, the resistor 600 and the capacitor 601 are provided between the base of the transistor 410 and the collector of the transistor 411, not between the base and the collector of the transistor 410, whereby it is possible to suppress change in impedance of the output of the first stage amplifier circuit. Accordingly, design changes from the above-described general configuration are facilitated.

Figure 7:
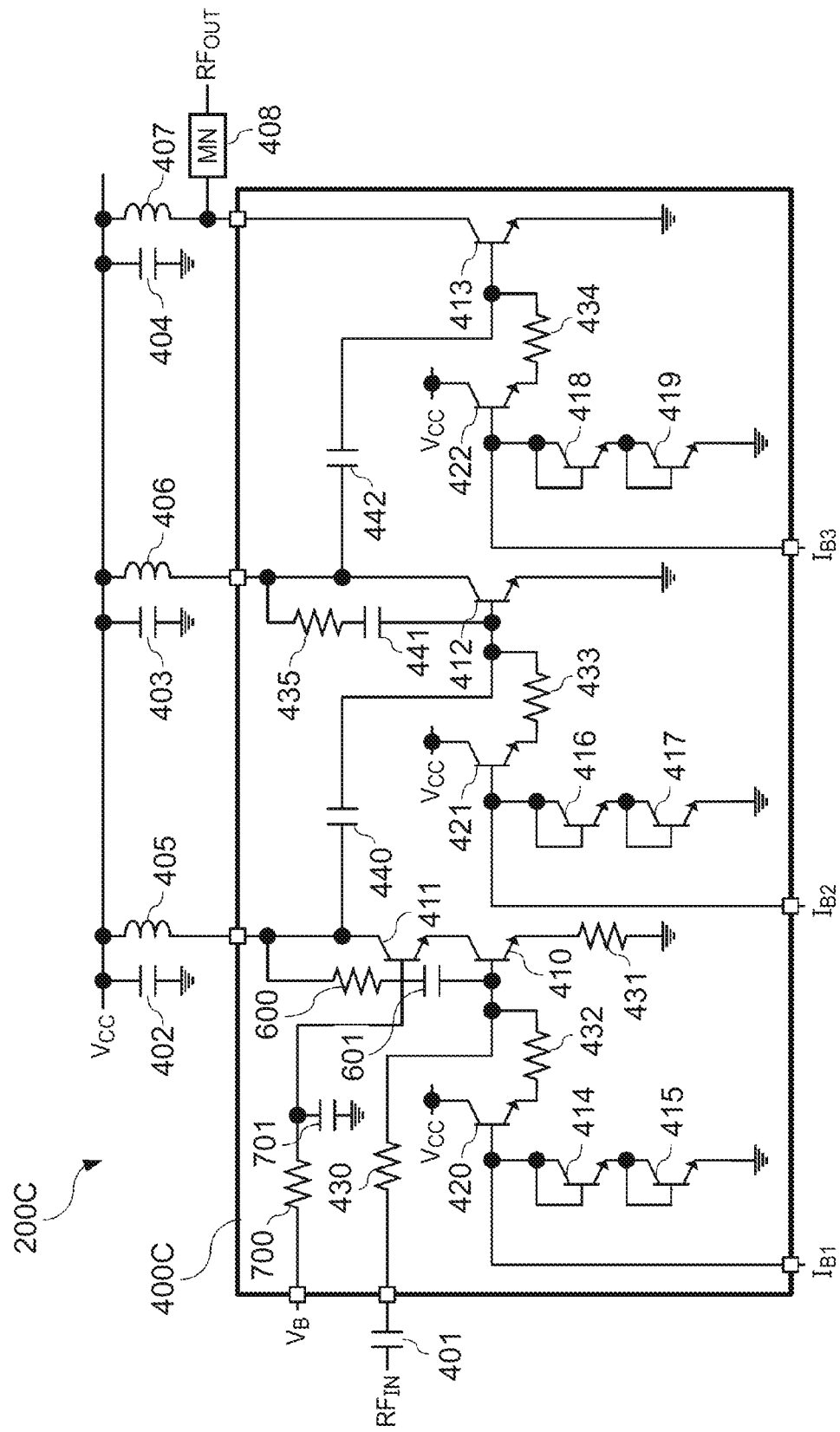
FIG. 7 is a diagram illustrating another example of the configuration of the power amplifier.

FIG. 7 is a diagram illustrating the configuration of a power amplifier 200C which is another example of the power amplifier 200. The same components as the power amplifier 200B illustrated in FIG. 6 are represented by the same reference numerals, and descriptions thereof will not be repeated.

The power amplifier 200C includes an HBT chip 400C, a resistor 700 and a capacitor 701, in addition to the configuration of the power amplifier 200B. The resistor 700 has one end connected to the input terminal of the gain control voltage $V_B$ and the other end connected to the base of the transistor 411. The capacitor 701 has one end connected between the resistor 700 and the base of the transistor 411, and the other end grounded. The resistor 700 and the capacitor 701 constitute a low-pass filter.

In this way, the gain control voltage $V_B$ is input to the base of the transistor 411 through the low-pass filter, whereby it is possible to suppress fluctuation in the gain of the power amplifier 200C due to noise of the gain control voltage $V_B$.

Figure 8:
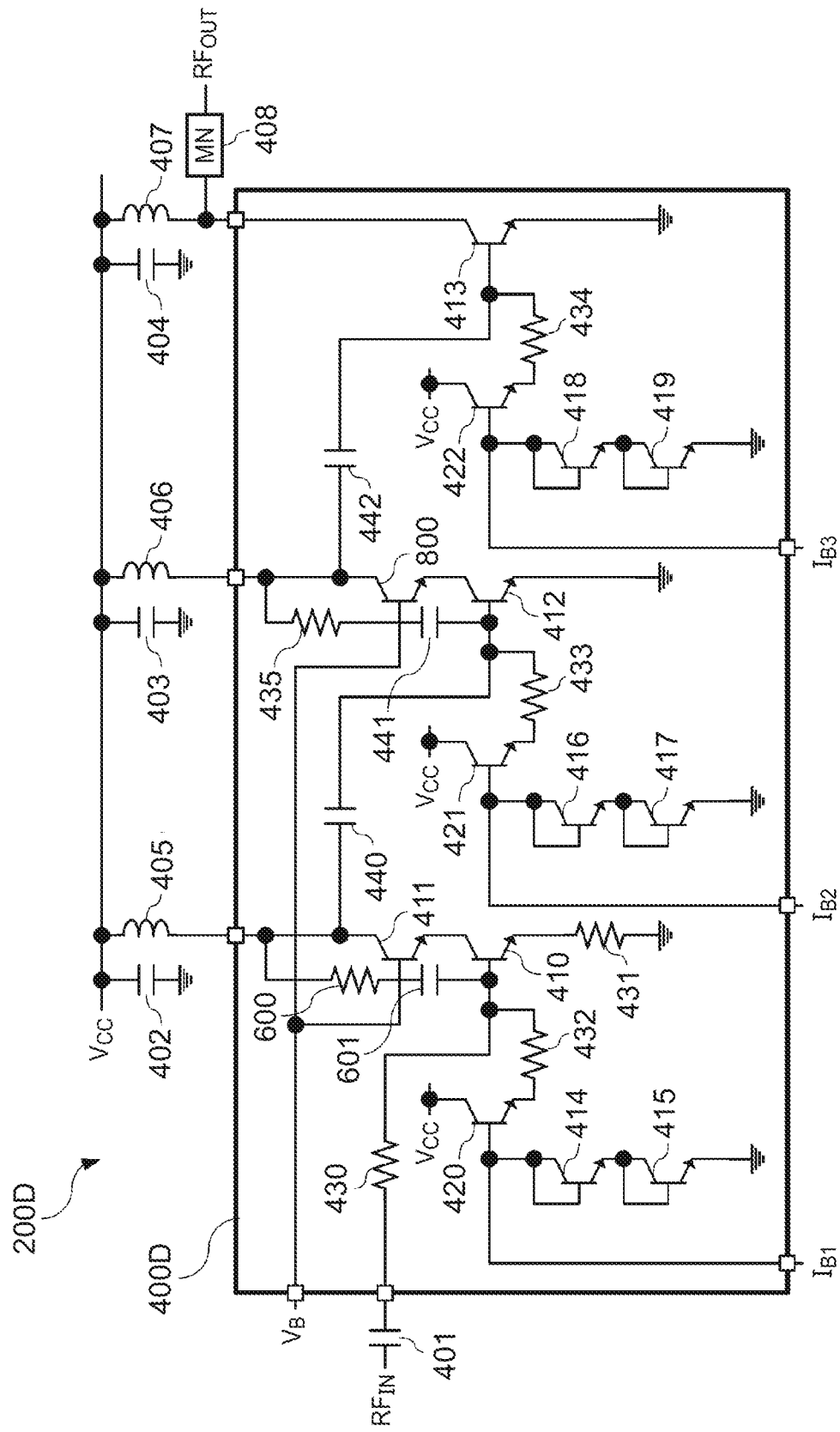
FIG. 8 is a diagram illustrating another example of the configuration of the power amplifier.

FIG. 8 is a diagram illustrating the configuration of a power amplifier 200D which is another example of the power amplifier 200. The same components as the power amplifier 200B illustrated in FIG. 6 are represented by the same reference numerals, and descriptions thereof will not be repeated.

The power amplifier 200D includes an HBT chip 400D, a transistor 800 (fourth transistor), in addition to the configuration of the power amplifier 200B. The transistors 412 and 800 are cascode-connected as in the first stage amplifier circuit, and a configuration in which the gain is controlled by the gain control voltage $V_B$ and the gain control current $I_{B2}$ is made. With this, as in the first stage amplifier circuit, it is possible to reduce the gain of the second stage amplifier circuit in a region where the control voltage $V_{RAMP}$ is low. Accordingly, it is possible to further reduce the slope ($\Delta RF_{OUT}/\Delta V_{RAMP}$) in a region where the control voltage $V_{RAMP}$ is low and to make the rising of the gain in the power amplifier 200D gentle.

In the power amplifier 200D, as in the power amplifier 200C illustrated in FIG. 7, the low-pass filter which is constituted by the resistor 700 and the capacitor 701 may be provided.

Figure 9:
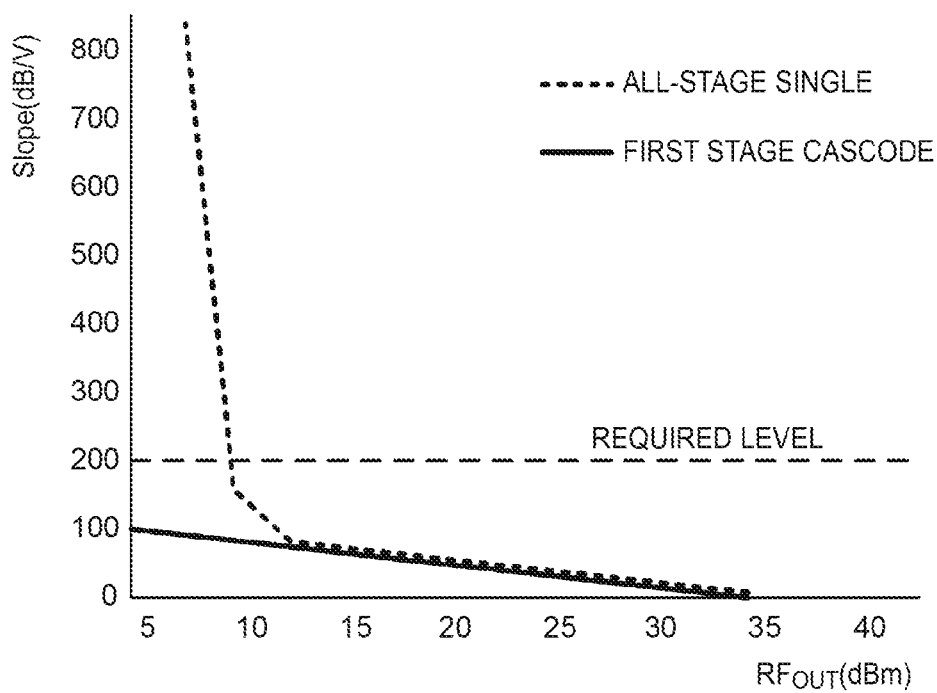
FIG. 9 is a simulation result illustrating an example of the relationship between an output signal and a slope in the power amplification module.
Figure 10:
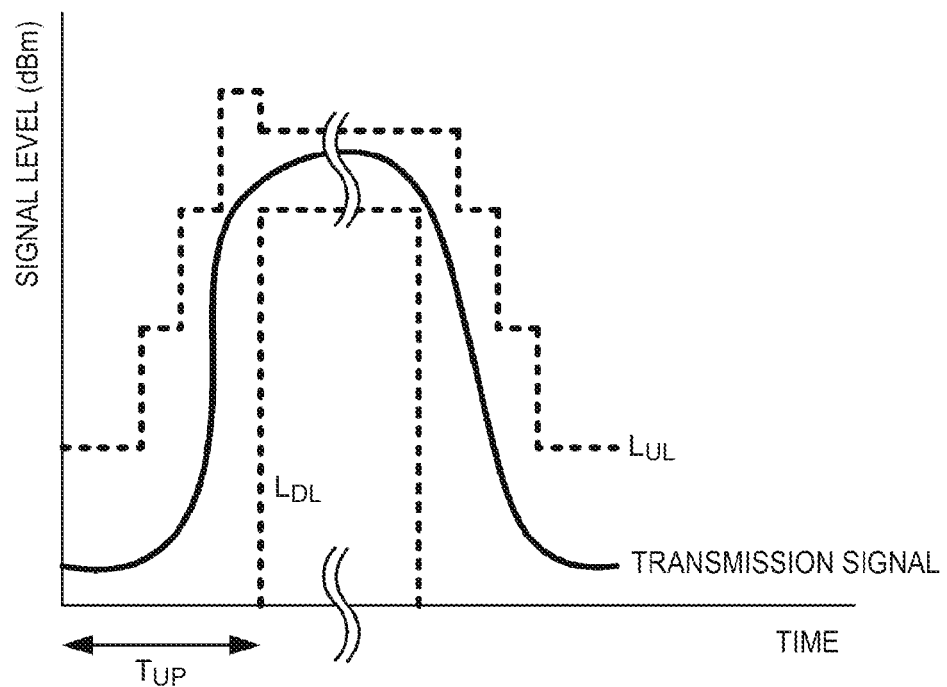
FIG. 10 is a diagram illustrating an example of a waveform characteristic defined for a burst operation.

FIG. 9 is a measurement result illustrating an example of the relationship between the output signal $RF_{OUT}$ and the slope ($\Delta RF_{OUT}/\Delta V_{RAMP}$) in the power amplification module. In FIG. 9, the solid line is a measurement result in the power amplification module 103 which includes the power amplifier 200C illustrated in FIG. 7. The broken line is a measurement result in a power amplification module having a general configuration (all-stage single) in which the first stage amplifier circuit of the power amplifier 200C is constituted only by the transistor 410.

As indicated by the broken line in FIG. 9, in the all-stage single configuration, the slope becomes comparatively larger in a region where the output signal $RF_{OUT}$ is low. Accordingly, in the all-stage single configuration, for example, when increasing the gain during a ramp-up period in the power amplification module, the rising of the gain becomes steeper, and it is difficult to control the output signal $RF_{OUT}$ conforming to the waveform characteristic defined by the communication standard.

As indicated by the solid line in FIG. 9, in the configuration of the power amplifier 200C illustrated in FIG. 7, that is, in the configuration in which the first stage amplifier circuit is constituted by the cascode-connected transistors 410 and 411, the slope becomes comparatively smaller in a region where the output signal $RF_{OUT}$ is low. Accordingly, in the configuration in which the first stage amplifier circuit is cascode-connected, for example, when increasing the gain during the ramp-up period in the power amplification module, the rising of the gain is made gentle, and it becomes easy to control the output signal $RF_{OUT}$ conforming to the waveform characteristic defined by the communication standard.

This embodiment has been described. As described above, according to this embodiment, the first stage amplifier circuit has a cascode configuration, the lower transistor is controlled by the gain control current $I_B$ according to the control voltage $V_{RAMP}$, and the upper transistor is controlled by the gain control voltage $V_B$ according to the control voltage $V_{RAMP}$, making it possible to adjust the rising characteristic of the gain. It is possible to make the size of the power amplification module comparatively small compared to a case where an LDO regulator is used.

For example, as illustrated in FIG. 3, the gain control current $I_{B1}$ changes in a quadratic curve shape with the control voltage $V_{RAMP}$, whereby it is possible to make the rising characteristic of the gain gentle compared to a case where the gain control current $I_{B1}$ changes in a linear shape.

The change characteristic of the gain control current $I_{B1}$ is not limited to a quadratic curve shape, and an increase rate of the gain control current $I_{B1}$ with the control voltage $V_{RAMP}$ becomes larger in a stepwise manner, thereby obtaining the same effects. Specifically, the gain control current generation circuit 300 may generate the gain control current $I_{B1}$ such that an increase rate of the gain control current $I_{B1}$ when the control voltage $V_{RAMP}$ is at first level becomes smaller than an increase rate of the gain control current $I_{B1}$ when the control voltage $V_{RAMP}$ is at second level (greater than the first level).

For example, as illustrated in FIG. 6, in the first stage amplifier circuit, when a negative feedback circuit is provided between the base of the transistor 410 and the collector of the transistor 411, and the first stage amplifier circuit is changed from the single configuration to the cascode configuration, it is possible to suppress change in impedance of the output of the first stage amplifier circuit.

For example, as illustrated in FIG. 7, the gain control voltage $V_B$ is supplied through the low-pass filter, whereby it is possible to suppress fluctuation in the gain of the power amplification module due to noise of the gain control voltage $V_B$.

For example, as illustrated in FIG. 8, the second stage amplifier circuit has a cascode configuration, whereby it is possible to further facilitate the adjustment of the rising characteristic of the gain.

The embodiment is simply for ease of understanding of the invention, and is not in any way to be construed as limiting the invention. The invention may be altered or improved without departing from the spirit and encompass equivalents thereof.

DESCRIPTION OF REFERENCE NUMERALS

100: transmission unit
101: baseband processing unit
102: modulation unit
103: power amplification module
104: front-end unit
105: antenna
200: power amplifier
201: filter
202: operational amplifier
203: directional coupler
204: detector 205: differential amplifier
206: error amplifier
207: bias control circuit
208 to 210, 430 to 435, 600, 700: resistor
300 to 302: gain control current generation circuit
400A to 400D: HBT chip
401 to 404, 440 to 442, 601, 701: capacitor
405 to 407: inductor
408: matching circuit
410 to 422, 800: NPN transistor

What is claimed is:

1. A power amplification module comprising:
a first gain control current generation circuit configured to generate a first gain control current changing with a control voltage;
a first bias current generation circuit configured to generate a first bias current according to the first gain control current;
a gain control voltage generation circuit configured to generate a gain control voltage changing with the control voltage;
a first transistor which is emitter-grounded, an input signal and the first bias current being supplied to a base of the first transistor; and
a second transistor which is cascode-connected to the first transistor, the gain control voltage being supplied to a base of the second transistor, and a first output signal obtained by amplifying the input signal being output from a collector of the second transistor,
wherein the first gain control current generation circuit is configured to generate the first gain control current such that an increase rate of the first gain control current when the control voltage is at a first level is smaller than an increase rate of the first gain control current when the control voltage is at a second level higher than the first level, and
wherein the gain control voltage generation circuit is configured to generate the gain control voltage such that the gain control voltage changes linearly with the control voltage.

2. The power amplification module according to claim 1, wherein the first gain control current generation circuit is configured to generate the first gain control current such that the first gain control current changes in a quadratic curve shape with the control voltage.

3. The power amplification module according to claim 1, further comprising:
a negative feedback circuit which is provided between the collector of the second transistor and the base of the first transistor.

4. The power amplification module according to claim 1, further comprising:
a low-pass filter which is connected to the base of the second transistor.

5. The power amplification module according to claim 1, further comprising:
a second gain control current generation circuit configured to generate a second gain control current changing with the control voltage;
a second bias current generation circuit configured to generates a second bias current according to the second gain control current; and
a third transistor which is emitter-grounded, the first output signal and the second bias current being supplied to a base of the third transistor, and a second output signal obtained by amplifying the first output signal being output from a collector of the third transistor.

6. The power amplification module according to claim 5, further comprising:
a fourth transistor which is cascode-connected to the third transistor, the gain control voltage being supplied to a base of the fourth transistor, and the second output signal being output from a collector of the fourth transistor.

7. The power amplification module according to claim 5, further comprising:
a third gain control current generation circuit configured to generate a third gain control current changing with the control voltage;
a third bias current generation circuit configured to generate a third bias current according to the third gain control current; and
a fifth transistor which is emitter-grounded, the second output signal and the third bias current being supplied to a base of the fifth transistor, and a third output signal obtained by amplifying the second output signal being output from a collector of the fifth transistor.

8. The power amplification module according to claim 5, further comprising:
a negative feedback circuit which is provided between the collector of the third transistor and the base of the third transistor.

9. The power amplification module according to claim 6, further comprising:
a negative feedback circuit which is provided between the collector of the fourth transistor and the base of the third transistor.

10. The power amplification module according to claim 1, wherein a power supply voltage is supplied to the collector of the second transistor through an inductor.

11. The power amplification module according to claim 1, wherein the first bias current generation circuit comprises:
a sixth transistor which is emitter grounded;
a seventh transistor which has an emitter connected to a collector of the sixth transistor; and
an eighth transistor which has a base connected to a collector of the seventh transistor, an emitter of the eighth transistor being connected to the base of the first transistor,
wherein the first gain control current is supplied to the collector of the seventh transistor and the base of the eighth transistor, and the first bias current is output at the emitter of the eighth transistor.

12. The power amplification module according to claim 1, further comprising:
a negative feedback circuit which is provided between the collector of the second transistor and the base of the first transistor.

13. The power amplification module according to claim 2, further comprising:
a negative feedback circuit which is provided between the collector of the second transistor and the base of the first transistor.

14. The power amplification module according to claim 12, further comprising:
a low-pass filter which is connected to the base of the second transistor.

15. The power amplification module according to claim 13, further comprising:
a low-pass filter which is connected to the base of the second transistor.

16. The power amplification module according to claim 12, further comprising:
- a second gain control current generation circuit configured to generate a second gain control current changing with the control voltage;
- a second bias current generation circuit configured to generates a second bias current according to the second gain control current; and
- a third transistor which is emitter-grounded, the first output signal and the second bias current being supplied to a base of the third transistor, and a second output signal obtained by amplifying the first output signal being output from a collector of the third transistor.

17. The power amplification module according to claim 15, further comprising:
- a second gain control current generation circuit configured to generate a second gain control current changing with the control voltage;
- a second bias current generation circuit configured to generates a second bias current according to the second gain control current; and
- a third transistor which is emitter-grounded, the first output signal and the second bias current being supplied to a base of the third transistor, and a second output signal obtained by amplifying the first output signal being output from a collector of the third transistor.

18. The power amplification module according to claim 16, further comprising:
- a fourth transistor which is cascode-connected to the third transistor, the gain control voltage being supplied to a base of the fourth transistor, and the second output signal being output from a collector of the fourth transistor.

19. The power amplification module according to claim 17, further comprising:
- a fourth transistor which is cascode-connected to the third transistor, the gain control voltage being supplied to a base of the fourth transistor, and the second output signal being output from a collector of the fourth transistor.

20. A power amplification module comprising:
- a first gain control current generation circuit configured to generate a first gain control current changing with a control voltage;
- a first bias current generation circuit configured to generate a first bias current according to the first gain control current;
- a gain control voltage generation circuit configured to generate a gain control voltage changing with the control voltage;
- a first transistor which is emitter-grounded, an input signal and the first bias current being supplied to a base of the first transistor; and
- a second transistor which is cascode-connected to the first transistor, the gain control voltage being supplied to a base of the second transistor, and a first output signal obtained by amplifying the input signal being output from a collector of the second transistor,
- wherein the first bias current generation circuit comprises:
- a sixth transistor which is emitter grounded;
- a seventh transistor which has an emitter connected to a collector of the sixth transistor; and
- an eighth transistor which has a base connected to a collector of the seventh transistor, an emitter of the eighth transistor being connected to the base of the first transistor,
- wherein the first gain control current is supplied to the collector of the seventh transistor and the base of the eighth transistor, and the first bias current is output at the emitter of the eighth transistor.

* * * * *